United States Patent [19]
Matsuda et al.

[11] Patent Number: 6,064,243
[45] Date of Patent: May 16, 2000

[54] CURRENT SWITCH AND PLL IN WHICH IT IS USED

[75] Inventors: Atsushi Matsuda; Yuji Segawa; Kunihiko Gotoh, all of Kawasaki, Japan

[73] Assignee: Fujitsu Limited, Kawasaki, Japan

[21] Appl. No.: 09/024,058

[22] Filed: Feb. 17, 1998

[30] Foreign Application Priority Data

May 20, 1997 [JP] Japan ................................ 9-129182

[51] Int. Cl.[7] ............................................. H03L 7/06
[52] U.S. Cl. ................................................. 327/156
[58] Field of Search .................................. 327/108, 112, 327/147, 148, 150, 155, 156, 157, 159; 331/17; 375/373, 375, 376

[56] References Cited

U.S. PATENT DOCUMENTS

| 5,103,191 | 4/1992 | Werker | 331/1 A |
|---|---|---|---|
| 5,473,283 | 12/1995 | Luich | 327/157 |
| 5,508,702 | 4/1996 | Estrada et al. | 341/136 |
| 5,576,647 | 11/1996 | Sutardja et al. | 327/108 |
| 5,734,279 | 3/1998 | Bereza | 327/157 |
| 5,801,578 | 9/1998 | Bereza | 327/157 |
| 5,886,551 | 3/1999 | Narahara | 327/156 |
| 5,898,336 | 4/1999 | Yamaguchi | 327/156 |
| 5,912,575 | 6/1999 | Takikawa | 327/157 |

FOREIGN PATENT DOCUMENTS 0 072 751  2/1983  European Pat. Off. .

*Primary Examiner*—My-Trang Nu Ton
*Attorney, Agent, or Firm*—Armstrong, Westerman, Hattori, McLeland & Naughton

[57] ABSTRACT

The present invention is a current switch, which supplies a constant current to a load circuit, and comprises: a transistor, the gate of which is supplied with a predetermined constant voltage, and the drain of which is connected to the above-mentioned load circuit; and a constant voltage supply circuit, which, in response to a control signal, supplies to the source of the above-mentioned transistor a first constant voltage, or a second constant voltage that differs from the first constant voltage, wherein when the above-mentioned first constant voltage is supplied to the above-mentioned transistor source by the above-mentioned constant voltage supply circuit, the transistor is turned ON and supplies the above-mentioned constant current to the above-mentioned load circuit, and when the above-mentioned secondary constant voltage is supplied to the above-mentioned transistor source, the transistor is turned OFF and interrupts the above-mentioned constant current. With a current switch configured as described above, high-precision current can be supplied and interrupted at the start and interruption of the current supply.

7 Claims, 9 Drawing Sheets

PLL CIRCUIT

CURRENT SWITCH AND PLL IN WHICH IT IS USED

BACKGROUND OF THE INVENTION

1. Field of the Invention

The present invention relates to a current switch capable of precisely switching the current from a current source that uses a metal-oxide semiconductor (MOS) transistor or a metal-insulator semiconductor (MIS) transistor, and the phase-locked loop (PLL) or digital-to-analog (DA) converter that utilizes it.

2. Description of the Related Art

There are circuits that supply to capacitance and resistance, for example, current from a current source that uses an MOS transistor or an MIS transistor, either using the voltage of capacitance after a fixed period of time, or the voltage generated by resistance. For instance, the input voltage of a PLL's voltage-controlled oscillator requires high precision, and when generating input voltage by charging or discharging capacitance proportional to phase difference, current from a current source must be precisely supplied for charging/discharging purposes. Further, in a DA converter, high-precision analog voltage can be generated by precisely supplying to a resistance device current from a current source selected in accordance with the digital signal that is input.

FIG. 11 depicts a conventional current switch. This circuit example is a current switch that supplies to the load circuit comprising capacitance $C_O$ current $I_1$ for charging via switch SW1, and current $I_2$ for discharging via switch SW2. Therefore, it is useful as a current switch even when used solely as a charging current switch or solely as a discharge current switch.

If this current switch is explained in terms of charging, for example, it is a circuit that supplies for a fixed period of time current from a current source comprising a p-type MOS transistor $P_1$ to the capacitance of a load circuit $C_O$ by closing switch SW1. As for the transistor that configures the current source $P_1$, its source terminal is connected to the power source $V_{DD}$, a constant voltage $Vg_1$ is applied to its gate, sufficient voltage is applied between its gate and source, and it conducts in the saturation region. Current $I_1$ is thus a fixed value. Switch SW1 is turned ON or OFF depending on a switching voltage $V_{SW1}$.

FIG. 12 is a waveform diagram for explaining the operation of the circuit depicted in FIG. 11. When the current switch is used to charge capacitance $C_O$, it maintains switching voltage $V_{SW1}$ at a high level for a fixed period of time t1, charges capacitance $C_O$ by supplying current $I_1$ to it, and raises the voltage of the output voltage $V_O$. The instant switch SW1 turns ON, drain voltage $V_1$ of the transistor $P_1$ changes to the voltage Vn determined as a result of capacitive coupling of capacitance $C_O$ and parasitic capacitance $C_{P1}$ from the level of the power $V_{DD}$ up until that time. Similarly, output $V_O$ also rises from the level it was at up until this time to the Vn voltage. The current $I_1$, as shown in FIG. 12, achieves a momentary large current value at this time.

The above-described voltage Vn can be determined from the capacitance $C_O$ and parasitic capacitance $C_{P1}$ circuits on either side via switch SW1. That is, if we make the capacitance $C_O$ voltage prior to switch SW1 closing equal to $V_{O1}$, then, according to the law of conservation of charge, the following equation holds true.

$$C_{P1}V_{DD}+C_OV_{O1}=Vn(C_{P1}+C_O)$$

Then, $$Vn=(C_{P1}V_{DD}+C_OV_{O1})/(C_{P1}+C_O)$$

In other words, if we make $V_{O1}=0v$, then the voltage value of the Vn voltage depends on the capacitance ratio of the power voltage $V_{DD}$.

When current $I_1$ is supplied to the capacitance $C_O$ for a fixed period of time in this state, the voltage $V_O$ rises. And since voltage V1 is at the same level as voltage $V_O$, it rises in the same manner. And when $V_{SW1}$ changes from a high to a low level, and switch SW1 turns OFF, then voltage $V_O$ only declines slightly, to the extent of the capacitive division of parasitic capacitance $C_{P3}$ and capacitance $C_O$ within the voltage fluctuation $\Delta V$ of $V_{SW1}$. The result of this, as shown in FIG. 12, is that current $I_1$ becomes an equivalent momentary negative current.

When the above-described transient current at the instant switch SW1 closes is not generated, and the transient current at the instant switch SW1 opens is not generated, the voltage $V_O$ changes as indicated in the figure by the broken line. That is, it becomes an ideal waveform. Therefore, the value of the actual voltage $V_O$ indicated by the solid line deviates from the ideal value indicated by the broken line.

With regard to the current switch discharge operation shown in FIG. 11, similarly, as a result of the current I2 becoming a transient current when switch SW2 closes, and a negative transient current when switch SW2 opens, the voltage $V_O$ deviates from the ideal value broken line.

SUMMARY OF THE INVENTION

An objective of the present invention is to provide a current switch capable of solving the above-described problems, and of precisely supplying current.

Furthermore, another objective of the present invention is to provide a PLL or digital-to-analog converter, which uses a current switch capable of precisely supplying current.

To achieve the above-described objectives, the present invention is a current switch, which supplies a constant current to a load circuit, and comprises:

- a transistor, the gate of which is supplied with a predetermined constant voltage, and the drain of which is connected to the above-mentioned load circuit; and
- a constant voltage supply circuit, which, in response to a control signal, supplies to the source of the above-mentioned transistor a first constant voltage, or a second constant voltage that differs from the first constant voltage, wherein when the above-mentioned first constant voltage is supplied to the above-mentioned transistor source by the above-mentioned constant voltage supply circuit, the transistor is turned ON and supplies the above-mentioned constant current to the above-mentioned load circuit, and when the above-mentioned secondary constant voltage is supplied to the above-mentioned transistor source, the transistor is turned OFF and interrupts the above-mentioned constant current.

With a current switch configured as described above, high-precision current can be supplied and interrupted at the start and interruption of the current supply.

The above-described constant voltage supply circuit comprises an inverter circuit provided between the first constant voltage and the second constant voltage, and in response to the input of the above-mentioned control signals, generates the above-mentioned first constant voltage or second constant voltage as output.

In addition, to attain the above-described objectives, the present invention comprises a phase-locked loop (PLL), which generates an output signal that is synchronized to the phase of an input signal, comprising:

a phase comparator, which compares the phase of above-mentioned input signal with a reference signal that divides the above-mentioned output signals, and which generates a control signal proportional to the phase difference;

a filter circuit, comprising
  a load capacitance; and
  a current switch having a transistor, the gate of which is supplied with a predetermined constant voltage, and the drain of which is connected to the above-mentioned load capacitance, and a constant voltage supply circuit, which, in response to the above-mentioned control signal, supplies to the above-mentioned transistor source a first constant voltage, or a second constant voltage that differs from the first constant voltage, wherein when the above-mentioned primary constant voltage is supplied to the above-mentioned transistor source by the above-mentioned constant voltage supply circuit, the transistor is turned ON and supplies constant current to the above-mentioned load capacitance, and when the above-mentioned second constant voltage is supplied to the above-mentioned transistor source, the transistor is turned OFF and interrupts the above-mentioned constant current; and a voltage-controlled oscillator, to which the above-mentioned load capacitance voltage is applied as input voltage, and which generates as the above-mentioned output signal a signal with a frequency that corresponds to this input voltage.

In addition, to attain the above-described objectives, the present invention comprises a digital-to-analog DA converter, which converts digital input signals to analog output signals, comprising:

a load circuit;

a group of current switches, which comprise a plurality of transistors, the gates of which are supplied with a predetermined constant voltage, and the drains of which are each connected to the above-mentioned load circuit; and a plurality of constant voltage supply circuits, which, in response to the above-mentioned digital control signals, supply to each of the sources of the above-mentioned transistors first constant voltages, or second constant voltages that differ from the first constant voltages; wherein when the above-mentioned first constant voltages are supplied to the above-mentioned transistor sources by the above-mentioned constant voltage supply circuits, the transistors are turned ON and supply constant currents to the above-mentioned load circuit, and when the above-mentioned second constant voltages are supplied to the above-mentioned transistor sources, the transistors are turned OFF and interrupt the above-mentioned constant currents; and an output circuit, which outputs as the above-mentioned analog output signals the signals generated in accordance with the total amount of the above-mentioned constant current supplied to the above-mentioned load circuit.

DESCRIPTION OF THE PREFERRED EMBODIMENTS

The following explanation describes the embodiments of the present invention in accordance with the figures. However, these embodiments do not limit the technological scope of the present invention.

Figure 1:
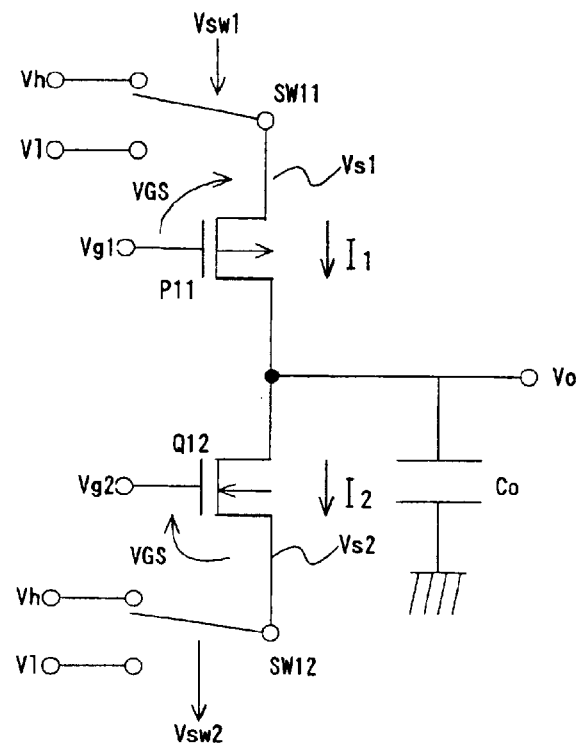
FIG. 1 depicts the current switch embodiment of the present invention.
Figure 2:
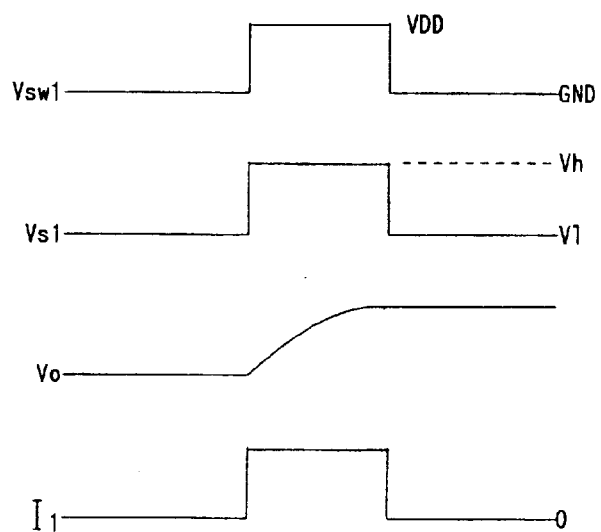
FIG. 2 is a waveform diagram for explaining the operation of the current switch depicted in FIG. 1.

FIG. 1 depicts the current switch embodiment of the present invention. And FIG. 2 is a waveform diagram for explaining its operation. In this current switch, the drain of a p-type transistor $P_{11}$, which is the source of a current $I_1$, is connected directly to the capacitance $C_O$ of a load circuit, and the source terminal of the transistor $P_{11}$ is connected via a switch SW11 to a high constant voltage terminal vh and a low constant voltage terminal Vl. That is, the switch SW11 and the constant voltage terminals Vh, Vl comprise a constant voltage supply circuit.

When the transistor source terminal is connected to the high constant voltage terminal Vh, the voltage between the gate and source $V_{GS}$ of the transistor $P_{11}$ exceeds the threshold voltage, the transistor $P_{11}$ turns ON, and current $I_1$ is supplied to the capacitance $C_O$. Furthermore, constant voltage Vh and constant voltage $V_{g1}$ are set so that the transistor $P_{11}$ conducts in the saturation region and generates a constant current $I_1$. And when the source terminal of the transistor $P_{11}$ is connected to the low constant voltage terminal Vl, the voltage between the gate and source $V_{GS}$ of the transistor $P_{11}$ is less than the threshold voltage, the transistor $P_{11}$ turns OFF, and constant current $I_1$ is no longer supplied.

Because the transistor $P_{11}$ that serves as the current source $I_1$ and the capacitance $C_O$ load circuit are directly connected, the rising up or falling off of the switching voltage $V_{SW1}$ either commences the supply of current $I_1$ by switching switch SW11 to the high voltage side Vh, or stops the supply of current $I_1$ by switching switch SW11 to the low voltage side Vl. However, as indicated in FIG. 2, a transient is not generated in the current from the current source $I_1$ as is the case with conventional examples. As a result, capacitance $C_O$ is charged using an ideal current value $I_1$, and the voltage $V_O$ displays an ideal ascending curve, as shown in FIG. 2.

Meanwhile, FIG. 1 also shows an n-type transistor $Q_{12}$ and a switch SW12 fabricated as a discharge current source $I_2$. The drain terminal of the transistor $Q_{12}$ is connected directly to the capacitance $C_O$. Also, the source terminal of the transistor $Q_{12}$ is connected via the switch SW12 to a high constant voltage terminal Vh or a low constant voltage terminal Vl. When the source terminal of the transistor $Q_{12}$ is connected to the high constant voltage terminal Vh, the voltage between the transistor gate and source $V_{GS}$ is less than the threshold voltage, and the transistor $Q_{12}$ turns OFF. And when the transistor source terminal is connected to the low constant voltage terminal Vl, the voltage between the transistor gate and source $V_{GS}$ exceeds the threshold voltage, the transistor $Q_{12}$ turns ON, and capacitance $C_O$ is discharged by the current $I_2$. That is, negative current $-I_2$ is supplied to the capacitance $C_O$.

There is no diagram showing the waveforms at discharge, but similar to charging, when the switch SW12 is switched, the momentary transient associated with conventional current switches is not generated. Therefore, since the capacitance $C_O$ is discharged by an ideal current $I_2$, the voltage $V_O$ descends at an ideal curve.

Whereas the load circuit in the embodiment shown in FIG. 1 is a grounded load capacitance, this embodiment is not limited to that configuration, and can feature either a load capacitance connected between power sources, or even a load resistance connected to a ground or power source. High-precision constant current can be supplied to any of these load circuit configurations.

Figure 3:
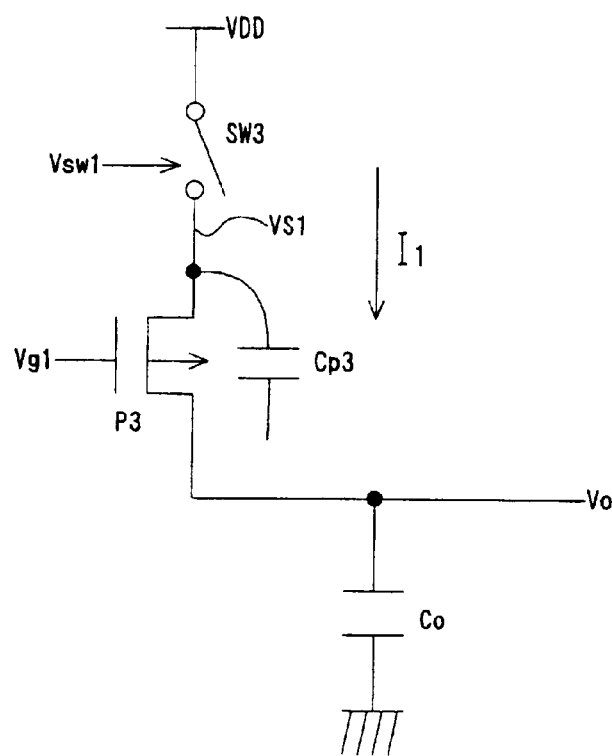
FIG. 3 depicts a comparative example.
Figure 4:
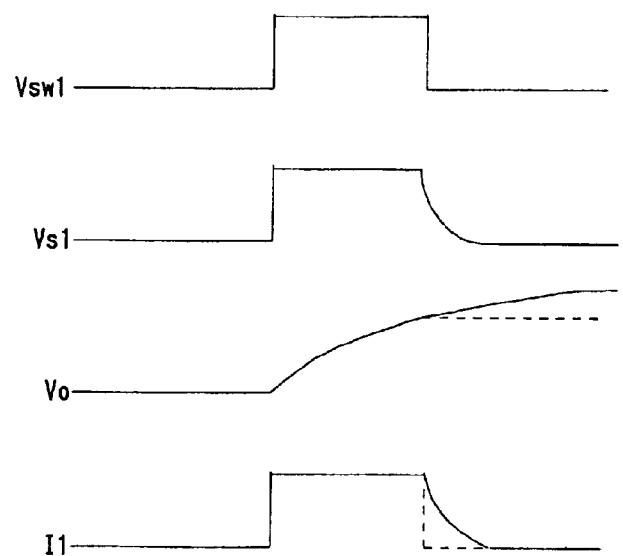
FIG. 4 is a waveform diagram for explaining the operation of the comparative example depicted in FIG. 3.
Figure 11:
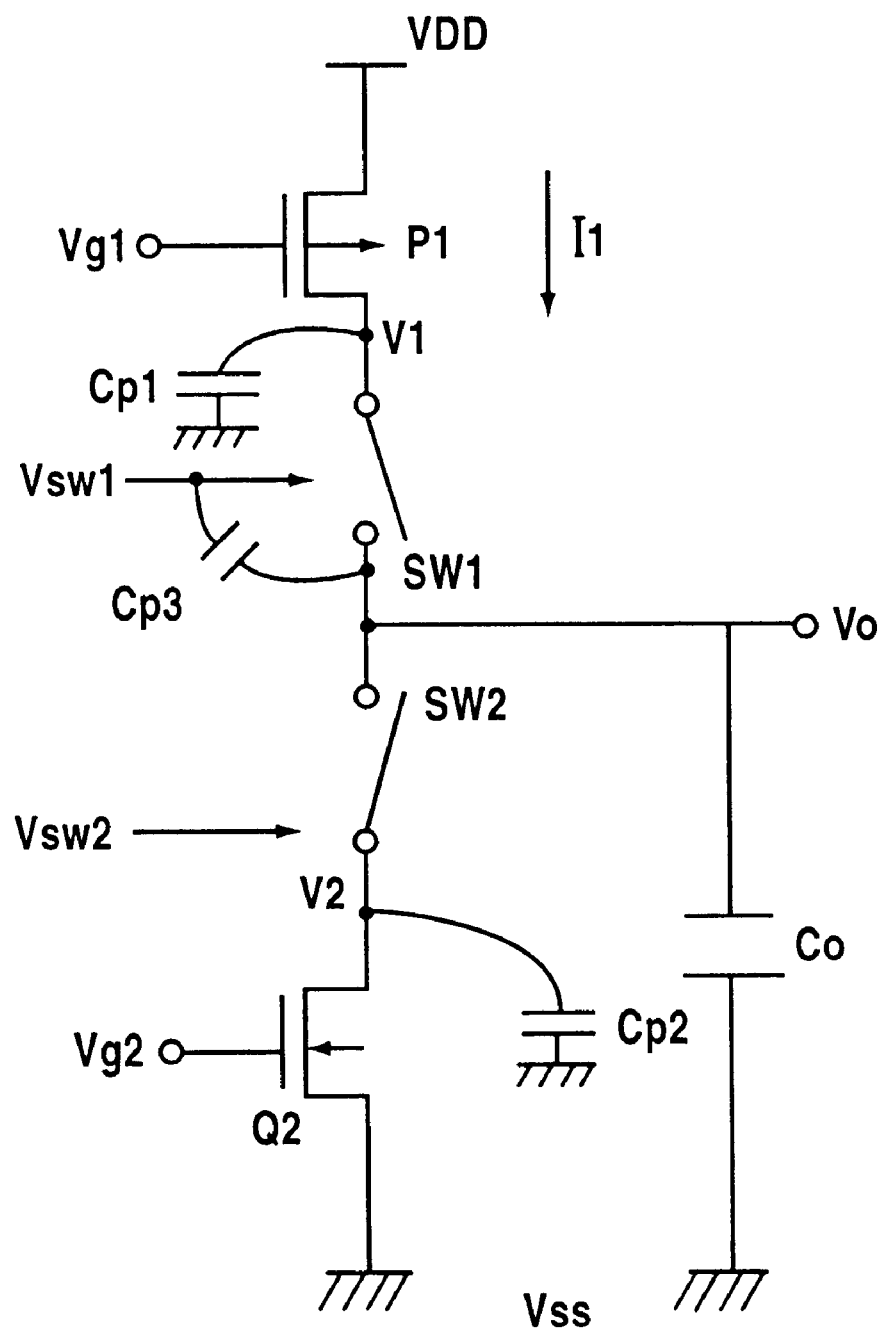
FIG. 11 depicts a conventional current switch.
Figure 12:
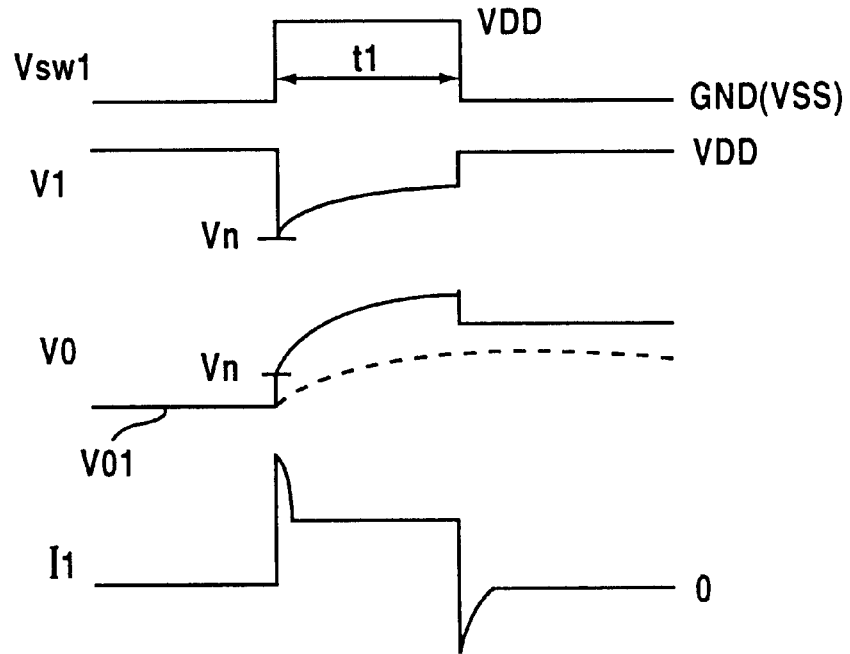
FIG. 12 is a waveform diagram for explaining the operation of the conventional current switch depicted in FIG. 11.
Figure 12:
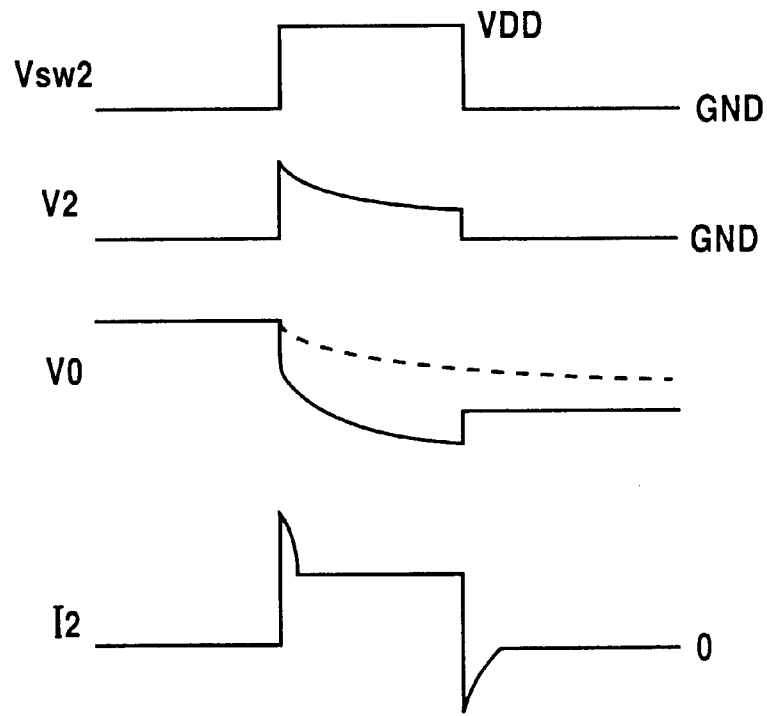

FIG. 3 depicts an example of a current switch used for comparison in explaining the advantages of the current switch embodiment shown in FIG. 1. And FIG. 4 is a waveform diagram depicting the operation of the comparative example shown in FIG. 3. Whereas a switch is mounted between the current source and the load capacitance $C_O$ in the example of a conventional current switch depicted in FIG. 11, in the comparative example, a switch SW3 is mounted between the current source transistor $P_3$ and the power source $V_{DD}$.

By using this configuration, when the switch SW3 is open, the transistor $P_3$ is OFF, and current $I_1$ is not supplied to the load capacitance $C_O$. Then, when the switch SW3 is closed, the source terminal voltage $V_{S1}$ of the transistor $P_3$ is raised by the supply voltage $V_{DD}$, the transistor $P_3$ turns ON, and the load capacitance $C_O$ is charged by the current $I_1$. Because the drain of the transistor $P_3$ is directly connected to the load capacitance $C_O$ at this time, a transient is not generated as in the example of the conventional current switch in FIG. 11.

However, even when the switch SW3 is opened to interrupt the current $I_1$ and turn the transistor $P_3$ OFF, the source terminal $V_{S1}$ is in a state of high impedance, and until the charge built up in the parasitic capacitance $C_{P3}$ is dissipated, the source terminal $V_{S1}$ maintains a high voltage and the transistor $P_3$ remains ON for a while. As a result, the current $I_1$, as indicated in FIG. 4, exhibits a tailed waveform brought on by not being instantaneously interrupted as indicated by the broken line. As a result of this off leakage current, the load capacitance $C_O$ continues to be charged even after the switch SW3 opens, and the value of the output voltage $V_O$ is slightly higher than the ideal indicated by the broken line.

In the embodiment of the circuit of the present invention shown in FIG. 1, when the switches SW1, SW2 are switched, the currents from the current sources $I_1$, $I_2$ are switched with good response. Therefore, this embodiment is able to supply and interrupt current to the load circuit more precisely than the comparative example described above.

Figure 5:
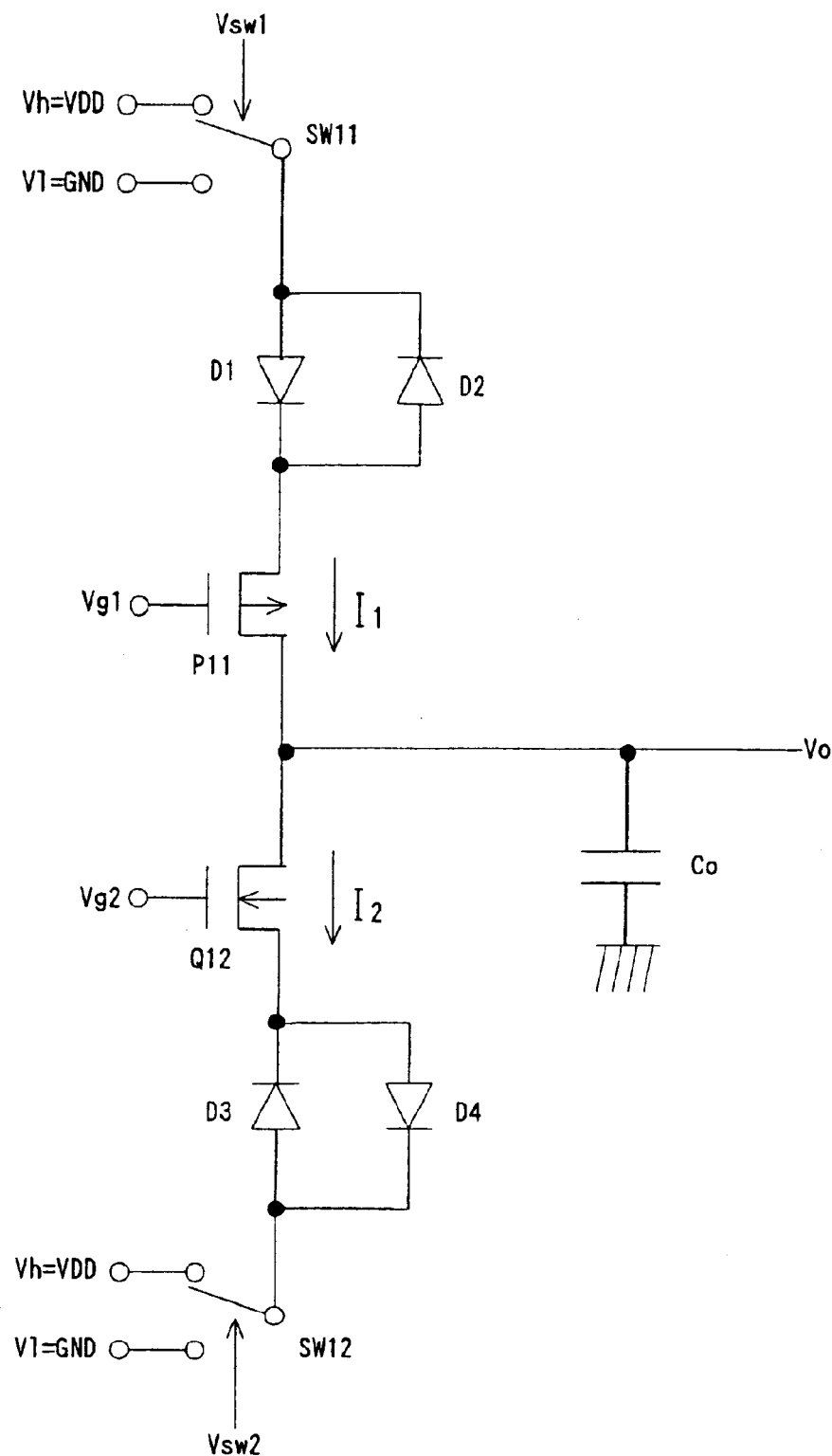
FIG. 5 depicts a modified example of the current switch embodiment of the present invention.

FIG. 5 depicts a modified example of this current switch embodiment. Those parts of this circuit that correspond to the circuit depicted in FIG. 1 are assigned the same reference numbers. This circuit differs from the circuit depicted in FIG. 1 firstly in that supply voltage $V_{DD}$ is assigned as the high constant voltage Vh, and ground voltage GND is assigned as the low constant voltage Vl. In this case, both voltages Vh, Vl are stable voltages. However, with voltages such as these, the voltage amplitude of the source terminal of transistor $P_{11}$ and the voltage amplitude of the source terminal of transistor $Q_{12}$ become too large. The second point where the circuit depicted in FIG. 5 differs from that depicted in FIG. 1 is that diodes D1, D2 providing bidirectional conduction have been provided between switch SW11 and transistor $P_{11}$, and similar diodes D3, D4 have been provided between switch SW12 and transistor $Q_{12}$.

These diodes D1–D4 all possess voltage drop functions. Therefore, by providing diodes D1–D4, the amplitudes of the source terminals of the respective transistors $P_{11}$, $Q_{12}$ become smaller than the supply voltage $V_{DD}$ only to the extent of the diode forward voltage.

Since the circuit depicted in FIG. 5 is similar to the circuit depicted in FIG. 1 in all other respects, an explanation of its operation is omitted.

[PLL circuit]

Figure 6:
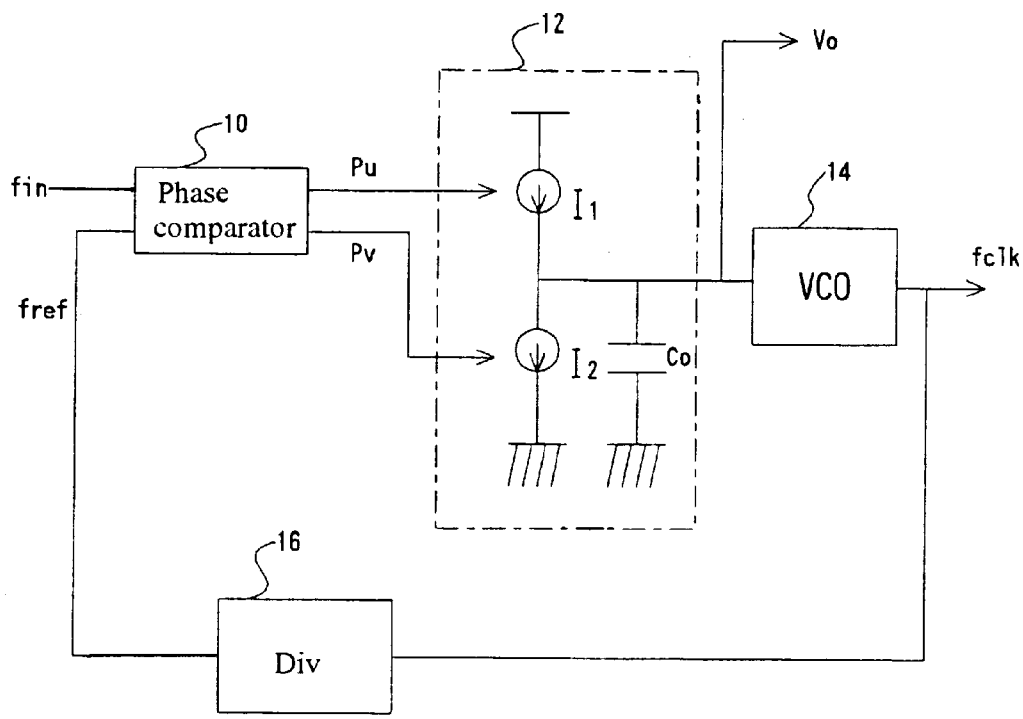
FIG. 6 depicts a general outline of a phase-locked loop PLL that utilizes a current switch.
Figure 7:
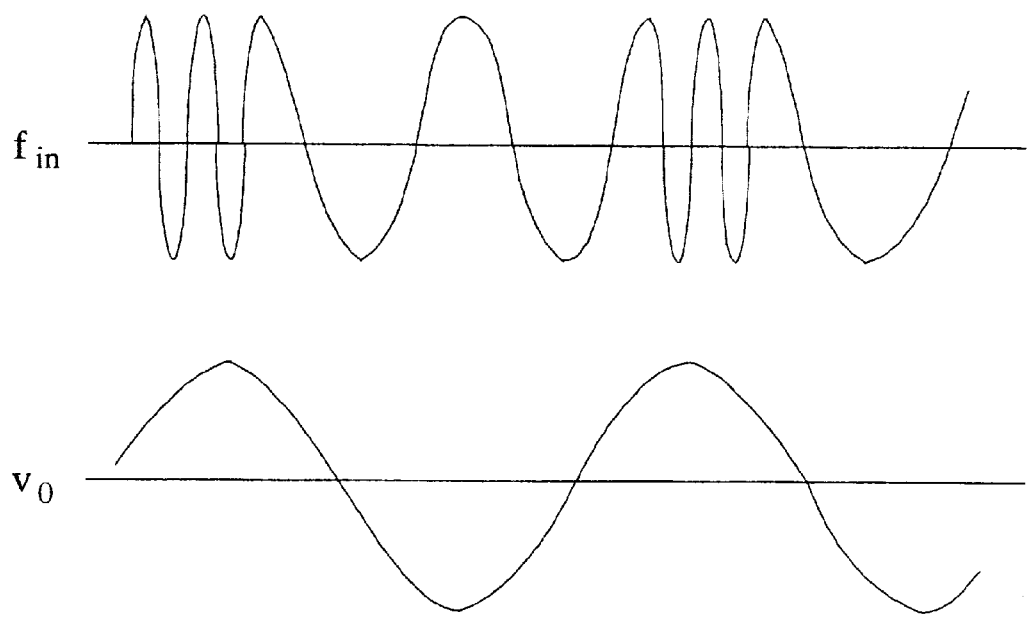
FIG. 7 is a waveform diagram of the input signal fin and voltage $V_O$ of the PLL depicted in FIG. 6.

FIG. 6 depicts a general outline of a phase-locked loop PLL that employs the above-described current switch. And FIG. 7 provides waveform diagrams of the input signal $f_{in}$ and voltage $V_O$ depicted in FIG. 6.

Generally, the PLL depicted in FIG. 6 is supplied an input signal $f_{in}$ with a predetermined frequency, and generates an output signal $f_{clk}$ with an integral multiple frequency in synchronous with this input signal $f_{in}$. A phase comparator 10 compares the phase of the input signal $f_{in}$ with a reference signal $f_{ref}$ obtained by dividing the output signal $f_{clk}$ by an integral ratio. When the input signal fin phase leads, the phase comparator generates a control pulse signal Pu with a pulse duration proportional to that phase difference. When the input signal $f_{in}$ phase lags, the phase comparator generates a control pulse signal Pv with a pulse duration proportional to that phase difference.

A loop filter 12, which is an integrated circuit, generates a voltage VO in accordance with the pulse durations of the above-mentioned pulse signals Pu, Pv. For example, when a Pu pulse signal is generated, the current switch charges the load capacitance $C_O$ with current II for the duration of that pulse, and only raises the output voltage $V_O$ for the length of that pulse duration. And when a Pv pulse signal is generated, the current switch discharges the load capacitance $C_O$ with current $I_2$ for the duration of that pulse, and only lowers the output voltage $V_O$ for the length of that pulse duration.

A voltage-controlled oscillator 14 generates an output frequency $f_{clk}$ in accordance with the input voltage $V_O$ generated by the load capacitance $C_O$. That is, in accordance with the input voltage $V_O$, the voltage-controlled oscillator 14 generates an output signal $f_{clk}$ with a frequency that is within the range of frequencies within its dynamic range.

Therefore, if we assume the voltage-controlled oscillator 14 generates a high-frequency output $f_{clk}$ relative to a high input voltage $V_O$, when the phase of the input signal $f_{in}$ leads that of the reference signal $f_{ref}$, the voltage $V_O$ rises in accordance with the detected pulse Pu, and the frequency of the output signal $f_{clk}$ generated by the voltage-controlled oscillator 14 increases. Then, when the phase of the input signal $f_{in}$ matches that of the reference signal $f_{ref}$, the loop is locked.

Conversely, when the phase of the input signal $f_{in}$ lags that of the reference signal $f_{ref}$, the voltage $V_O$ drops in accordance with the detected pulse Pv, and the frequency of the output signal $f_{clk}$ generated by the voltage-controlled oscillator 14 decreases. Then, when the phase of the input signal fin matches that of the reference signal $f_{ref}$, the loop is locked.

In addition to an ordinary PLL that generates a clock output signal phase-synchronized to an ordinary input signal, the embodiment of the present invention also proposes a PLL that generates as voltage $V_O$ the modulating signal of a received FM signal $f_{in}$.

As shown in FIG. 7, if we treat the input signal $f_{in}$ as an FM signal, the output $V_O$ of the loop filter 12 becomes the modulating signal of that FM signal. That is, when the frequency of the FM signal $f_{in}$ increases, the voltage of the output voltage $V_O$ also increases, and when the frequency of the FM signal $f_{in}$ decreases, the voltage of the output voltage $V_O$ also decreases. Therefore, the PLL depicted in FIG. 6 can be used as a detection circuit for FM signals $f_{in}$.

Thus, in the PLL depicted in FIG. 6, the switching of the current source $I_1$ for charging is performed by control pulse Pu, and the switching of the current source $I_2$ for discharging is performed by control pulse Pv. Therefore, the current switches depicted in FIG. 1 and FIG. 5 are used within the loop filter 12 of the PLL depicted in FIG. 6.

Figure 8:
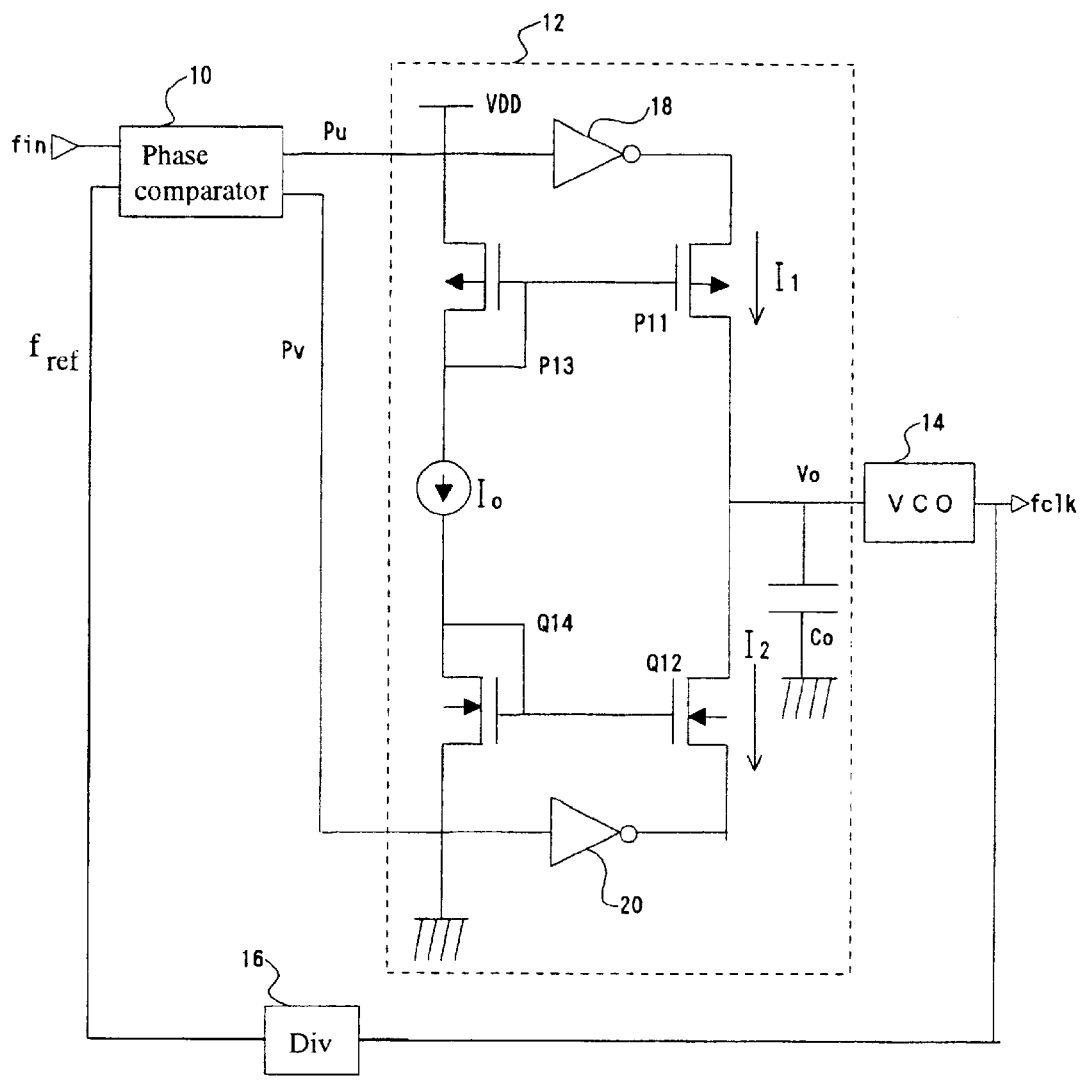
FIG. 8 depicts the detailed configuration of a PLL that uses this current switch embodiment.

FIG. 8 depicts the detailed configuration of the PLL that utilizes this embodiment of a current switch. Parts corresponding to those depicted in FIG. 6 have been assigned the same reference numbers. This example depicts in detail the configuration of the loop filter, which is an integrated circuit.

The p-type transistor $P_{11}$ and n-type transistor $Q_{12}$, which serve as current sources inside the loop filter, are connected directly to the load capacitance $C_O$. Further, transistor $P_{11}$ forms a current mirror with p-type transistor $P_{13}$, and current $I_1$ is generated by transistor $P_{11}$ in accordance with the ratio of the size of both transistors in relation to the current source $I_0$. Similarly, transistor $Q_{12}$ forms a current mirror with n-type transistor $Q_{14}$, and current $I_2$ is generated by transistor $Q_{12}$ in accordance with the ratio of the size of both transistors in relation to the current source $I_0$.

Also, output from an inverter 18 controlled by a control pulse Pu is connected to the source terminal of transistor $P_{11}$. And output from an inverter 20 controlled by a control pulse Pv is connected to the source terminal of transistor $Q_{12}$. Therefore, the outputs of these inverters 18, 20 are switched to either the supply voltage $V_{DD}$ or the ground GND by the control pulses Pu, Pv. Thus, the inverters 18, 20 correspond to the constant voltage generators configured from switches SW11 and SW12 depicted in FIG. 1 and FIG. 5.

Because the loop filter in the PLL depicted in FIG. 8 is capable of supplying high-precision current to the load capacitance $C_O$, it is possible to obtain a voltage $V_O$ that accurately corresponds to the pulse durations of the control pulses Pu, Pv generated proportional to the phase difference. Therefore, extremely high-precision operation is possible.

Figure 9:
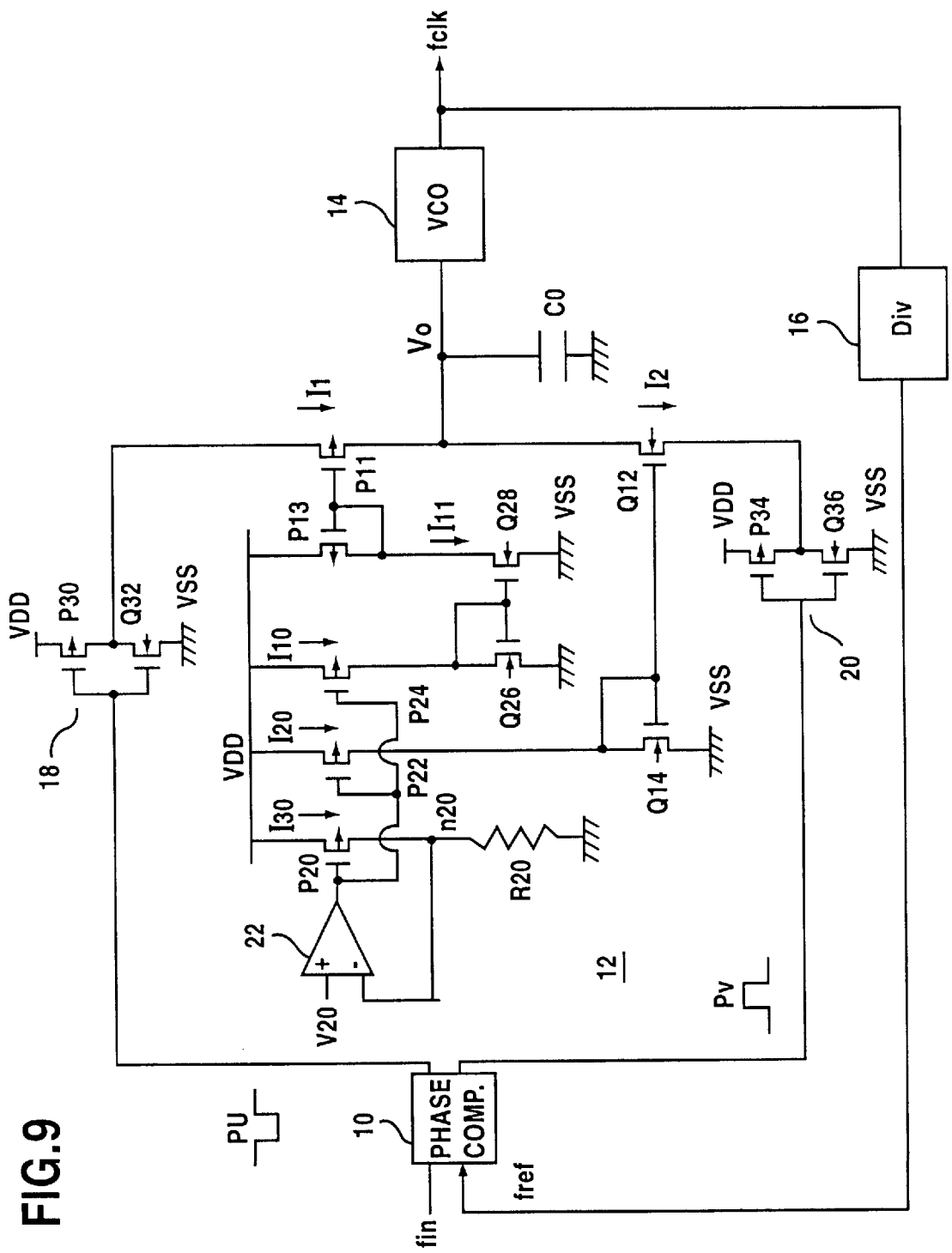
FIG. 9 depicts the loop filter of the PLL shown in FIG. 8 in even more detail.

FIG. 9 depicts the loop filter in the PLL shown in FIG. 8 in even more detail. This detailed circuit drawing depicts how the constant current source $I_0$ is formed within the loop filter 12. It also depicts the detailed configurations of the inverters 18, 20 in the loop filter 12.

In the loop filter 12 depicted in FIG. 9, a constant current $I_{30}$ is formed by a circuit comprising an operational amplifier 22, to which a constant voltage $V_{20}$ is supplied to the positive phase side input; a p-type transistor $P_{20}$, the gate of which is connected to the output of the operational amplifier 22, and the source of which is connected to the supply voltage $V_{DD}$; and a resistance $R_{20}$, which is connected between the drain of that transistor $P_{20}$ and a ground. That is, since the node $n_{20}$ of the resistance $R_{20}$ and the transistor $P_{20}$ is connected to the negative phase side input of the operational amplifier 22, the output level of the operational amplifier 22 is generated so that the voltage of the node $n_{20}$, which is determined by the current $I_{30}$ and the resistance $R_{20}$, is equivalent to the constant voltage $V_{22}$. Then, current $I_{30}$ that conforms to that output level is generated by the transistor $P_2$. If the current $I_{30}$ is small, the node $n_{20}$ voltage decreases, the operational amplifier 22 output level rises and the current $I_{30}$ is amplified. Conversely, if the current $I_{30}$ is large, the node $n_{20}$ voltage increases, the operational amplifier 22 output level drops and the current $I_{30}$ is reduced. The current $I_{30}$ is thus a stable, constant current.

Because p-type transistors $P_{22}$ and $P_{24}$ share a gate in common with transistor $P_{20}$, they generate constant currents $I_{20}$ and $I_{10}$ which correspond to their transistor size to the transistor $P_{20}$. Current $I_{10}$ generates current $I_{11}$ via n-type transistors $Q_{26}$ and $Q_{28}$, which comprise a current mirror. Current $I_{11}$ is a current value that is proportional to the transistor size of transistors $Q_{26}$ and $Q_{28}$. In addition, current $I_{11}$ generates charging current $I_1$ via p-type transistors $P_{11}$ and $P_{13}$, which comprise a current mirror. Similarly, current $I_{20}$ generates discharge current $I_2$ via n-type transistors $Q_{12}$ and $Q_{14}$, which comprise a current mirror. That is, charging current $I_1$ and discharge current $I_2$ are generated in accordance with currents $I_{10}$ and $I_{20}$ generated by the operational amplifier 22.

The inverter 18 in the loop filter 12 depicted in FIG. 9 is a complementary metal-oxide semiconductor CMOS inverter comprising a p-type transistor $P_{30}$ and an n-type transistor $Q_{32}$ provided between a ground $V_{SS}$ and a power source $V_{DD}$. Transistor $P_{30}$ is turned ON by the negative pulse of control signal Pu, which is detected by the phase detector 10, and it supplies supply voltage $V_{DD}$ to the source terminal of p-type transistor $P_{11}$, supplying charging current $I_1$. Thus, load capacitance $C_O$ is charged by the charging current $I_1$ for a period of time that corresponds to the pulse duration of control signal Pu, and the voltage $V_O$ rises.

Meanwhile, inverter 20 is also a CMOS inverter comprising a p-type transistor $P_{34}$ and an n-type transistor $Q_{36}$. Transistor $Q_{36}$ is turned ON by the positive pulse of control signal Pv, which is detected by the phase detector 10, and it supplies ground voltage $V_{SS}$ to the source terminal of n-type transistor $Q_{12}$, supplying discharge current $I_2$. Thus, load capacitance $C_O$ is discharged by the discharge current $I_2$ for a period of time that corresponds to the pulse duration of control signal Pv, and the voltage $V_O$ drops.

Therefore, when the phase comparator 10 detects that the frequency of the input signal $f_{in}$ is high, and its phase leads that of the reference signal $f_{ref}$, it outputs a control signal Pu with a pulse duration proportional to that phase difference. As a result, the voltage $V_O$ rises and heightens the frequency of the output signal $f_{out}$ only for the length of the pulse duration. Conversely, when the phase detector 10 detects that the frequency of the input signal $f_{in}$ is low, and its phase lags that of the reference signal $f_{ref}$, it outputs a control signal Pv with a pulse duration proportional to that phase difference. As a result, the voltage $V_O$ drops and lowers the frequency of the output signal $f_{out}$ only for the length of the pulse duration.

In this way, a current switch comprised of a current source transistor $P_{11}$, an inverter 18 and a load capacitance $C_O$ in the PLL depicted in FIG. 8 and FIG. 9 can precisely charge load capacitance $C_O$ using a constant current $I_1$. And similarly, a current switch comprised of a power transistor $Q_{12}$, an inverter 20 and a load capacitance $C_O$ can precisely discharge load capacitance $C_O$ using a constant current $I_2$.

Furthermore, because the current sources $I_1$, $I_2$ in the loop filter 12 are applied accurately, the response of the PLL can be speeded up, and PLL jitter can be reduced. Also, by heightening the precision of the loop filter, it is possible to increase the variation tolerance of other circuits.

[DA Converter]

Figure 10:
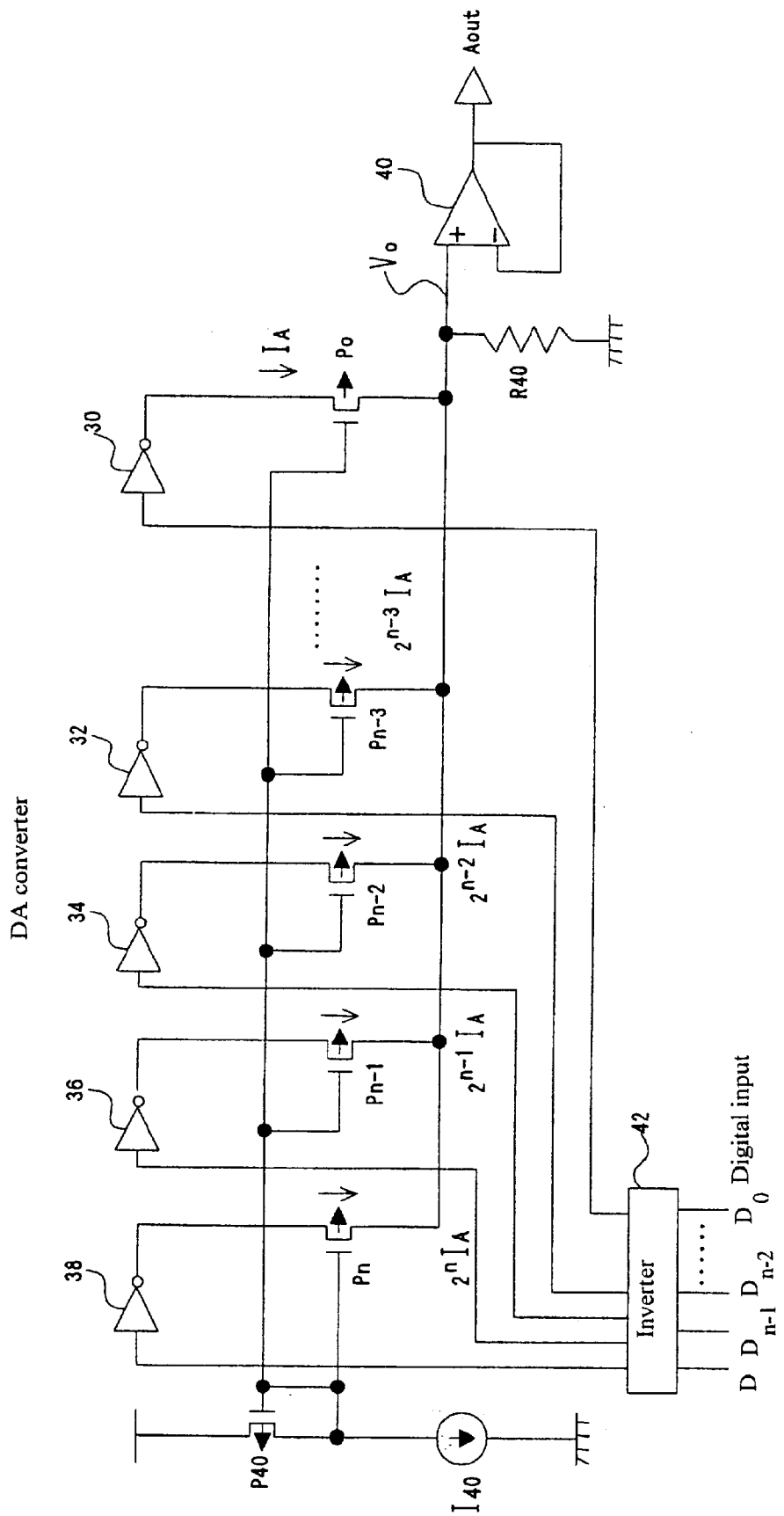
FIG. 10 depicts a DA converter that uses this current switch embodiment.

FIG. 10 depicts a DA converter that utilizes this current switch embodiment. This DA converter comprises p-type transistors $P_0$–$P_n$ in parallel for use as constant current source transistors. These transistors share their gates in common with p-type transistor $P_{40}$, forming a current mirror. A constant current source $I_{40}$ is connected to transistor $P_{40}$. The generation of this constant current source $I_{40}$ can be achieved using the same circuit configuration as the operational amplifier 22, transistor $P_{20}$, resistance $R_{20}$, transistor $P_{22}$ and transistors $Q_{12}$, $Q_{14}$ depicted in FIG. 9.

The size of each of the constant current transistors $P_0$–$P_n$ is designed so as to achieve the current values shown in the figure, i.e. $I_A$, $2I_A$, $2^2I_A$ ... $2^{n-3}I_A$, $2^{n-2}I_A$, $2^{n-1}I_A$, $2^nI_A$. Corresponding inverters 30–38 control the ON, OFF status of these transistors $P_0$–$P_n$. That is, when the inverters generate high level output, the corresponding constant current source transistors $P_0$–$P_n$ turn ON. Conversely, when the inverters generate low level output, the corresponding constant current source transistors $P_0$–$P_n$ turn OFF.

Therefore, the inverters 30–38 are controlled by signals that logically invert digital input $D_0D_n$ in inverter 42, and the digital input turns ON constant current source transistors that correspond to bit "1". Then, the total of these currents is supplied to load resistance $R_{40}$. The load resistance $R_{40}$ voltage drop is precisely generated by the high-precision application of constant current. Voltage $V_O$ is then amplified by a buffer amplifier 40, and an analog voltage output $V_{out}$ is generated.

Because a high-precision current is applied to load resistance in accordance with a digital input value, high-precision digital-to-analog conversion operations can be performed. The elimination of off leakage current in the current source transistors $P_0$–$P_n$ in particular, enhances conversion accuracy during highspeed DA conversion.

As explained herein, the present invention enables the provision of a current switch capable of precisely supplying constant current. And by using this current switch to configure a PLL, it is possible to provide a PLL capable of high-precision operation. Furthermore, by configuring a DA converter using the current switch, it is possible to provide a DA converter capable of high-precision conversion.

What is claimed is:

1. A current switch, which supplies a constant current to a load circuit, comprising:
    a transistor, the gate of which is supplied with a predetermined constant voltage, and the drain of which is connected to said load circuit; and
    a constant voltage supply circuit, which, in response to a control signal, supplies to the source of said transistor a first constant voltage, or a second constant voltage that differs from said first constant voltage,
    wherein when said first constant voltage is supplied to the source of said transistor by said constant voltage supply circuit, said transistor is turned ON and supplies said constant current to said load circuit, and when said second constant voltage is supplied to the source of said transistor, said transistor is turned OFF and interrupts said constant current,
    wherein a voltage drop device is provided between the source of said transistor and said constant voltage supply circuit.

2. The current switch according to claim 1, wherein said transistor is a p-type metal oxide semiconductor MOS transistor, and said first constant voltage is higher than said second constant voltage.

3. The current switch according to claim 1, wherein said transistor is an n-type MOS transistor, and said first constant voltage is lower than said second constant voltage.

4. The current switch according to claim 1, wherein said constant voltage supply circuit has an inverter circuit provided between the first constant voltage and the second constant voltage, and in response to said control signal supplied to its input, generates said first constant voltage or second constant voltage as output.

5. A phase-locked (PLL) which generates an output signal that is synchronized to the phase of an input signal, comprising:
    a phase comparator, which compares the phase of said input signal with a reference signal that divides said output signal, and which generates a control signal proportional to a phase difference;
    a filter circuit, comprising
        a load capacitance; and
        a current switch having a transistor, the gate of which is supplied with a predetermined constant voltage, and the drain of which is connected to said load capacitance, and a constant voltage supply circuit, which, in response to said control signal, supplies to the source of said transistor a first constant voltage, or a second constant voltage that differs from said first constant voltage, wherein when said first constant voltage is supplied to the source of said transistor by said constant voltage supply circuit, said transistor is turned ON and supplies said constant current to said load capacitance, and when said second constant voltage is supplied to the source of said transistor source, said transistor is turned OFF and interrupts said constant current; and
    a voltage-controlled oscillator, to which said load capacitance voltage is applied as input voltage, and which generates as said output signal a signal with a frequency that is proportional to said input voltage,
    wherein a voltage drop device is provided between the source of said transistor and said constant voltage supply circuit.

6. A PLL, which generates an output signal that is synchronized to the phase of an input signal, comprising:
    a phase comparator, which compares phase of said input signal with a reference signal that divides said output signal, and which generates a control signal proportional to a phase difference;
    a filter circuit comprising
        a load capacitance
        a first current switch comprising a p-type first transistor, the gate of which is supplied with a predetermined constant voltage, and the drain of which is connected to said load capacitance, and a first constant voltage supply circuit, which, in response to said control signal, supplies to the source of said first transistor a first constant voltage, or a second constant voltage that differs from said first constant voltage, wherein when said first constant voltage is supplied to the source of said first transistor by said first constant voltage supply circuit, said first transistor is turned ON and charges said load capacitance with a first constant current, and when said second constant voltage is supplied to the source of said first transistor, said first transistor is turned OFF and interrupts said first constant current, and a second current switch, comprising an n-type second transistor, the gate of which is supplied with a predetermined constant voltage, and the drain of which is connected to said load capacitance, and a second constant voltage supply circuit, which, in response to said control signal, supplies to the source of said second transistor a third constant voltage, or a fourth constant voltage that differs from said third constant voltage, wherein when said fourth constant voltage is supplied to the source of said second transistor by said second constant voltage supply circuit, said second transistor is turned ON and discharges said load capacitance using a second constant current, and when said third constant voltage is supplied to the source of said second transistor, said second transistor is turned OFF and interrupts said second constant current; and a voltage-controlled oscillator, to which said load capacitance voltage is applied as input voltage, and which generates as said output signal a signal with a frequency that is proportional to said input voltage, wherein a voltage drop device is provided between the source of said first transistor and said first constant voltage supply circuit and between the source of said second transistor and said second constant voltage supply circuit.

7. The PLL according to claims 5 or 6, wherein a frequency modulation (FM) signal is applied as said input signal, and said load capacitance voltage is output as a demodulating signal of said FM signal.

\* \* \* \* \*